United States Patent [19]

Dimotakis et al.

[11] 4,051,433
[45] Sept. 27, 1977

[54] SIGNAL RESPONSIVE BURST PERIOD TIMER AND COUNTER FOR LASER DOPPLER VELOCIMETRY AND THE LIKE

[75] Inventors: Paul E. Dimotakis, Altadena; Daniel B. Lang, Pasadena, both of Calif.

[73] Assignee: California Institute of Technology, Pasadena, Calif.

[21] Appl. No.: 612,269

[22] Filed: Sept. 11, 1975

[51] Int. Cl.$^2$ .......................................... G01R 23/02
[52] U.S. Cl. ................................... 324/78 R; 328/150
[58] Field of Search .................. 324/77 A, 78 D; 307/235 E, 235 N; 328/150

[56] References Cited

U.S. PATENT DOCUMENTS

| | | | |
|---|---|---|---|
| 3,205,445 | 9/1965 | Cubert | 328/150 |
| 3,512,093 | 5/1970 | Perreault | 328/150 |
| 3,903,470 | 9/1975 | Mirabile | 324/77 A |

Primary Examiner—M. Tokar
Attorney, Agent, or Firm—Lindenberg, Freilich, Wasserman, Rosen & Fernandez

[57] ABSTRACT

A signal responsive burst period timer and counter is provided for laser Doppler velocimetry, and the like, by bandpass filtering a signal burst and testing the filtered signal for exceeding a first level ($V_O - V_L$) and a second level ($V_O + V_L$), and subsequently crossing a reference level ($V_O$) from the second level, and in that order, to qualify each cycle of the signal burst for timing and counting. A timing system checks the reference crossing of every qualified cycle, in accordance with the level crossing logic criteria described above, to determine that it occurs within a prescribed time interval as measured from the previous qualified reference crossing. When the sequence ends, either because a predetermined number of qualified cycles have been received or because the signal fails to meet one of the amplitude or time criteria described above, the burst period counter stops, the data is read out and the counter resets itself to process the next burst.

30 Claims, 21 Drawing Figures

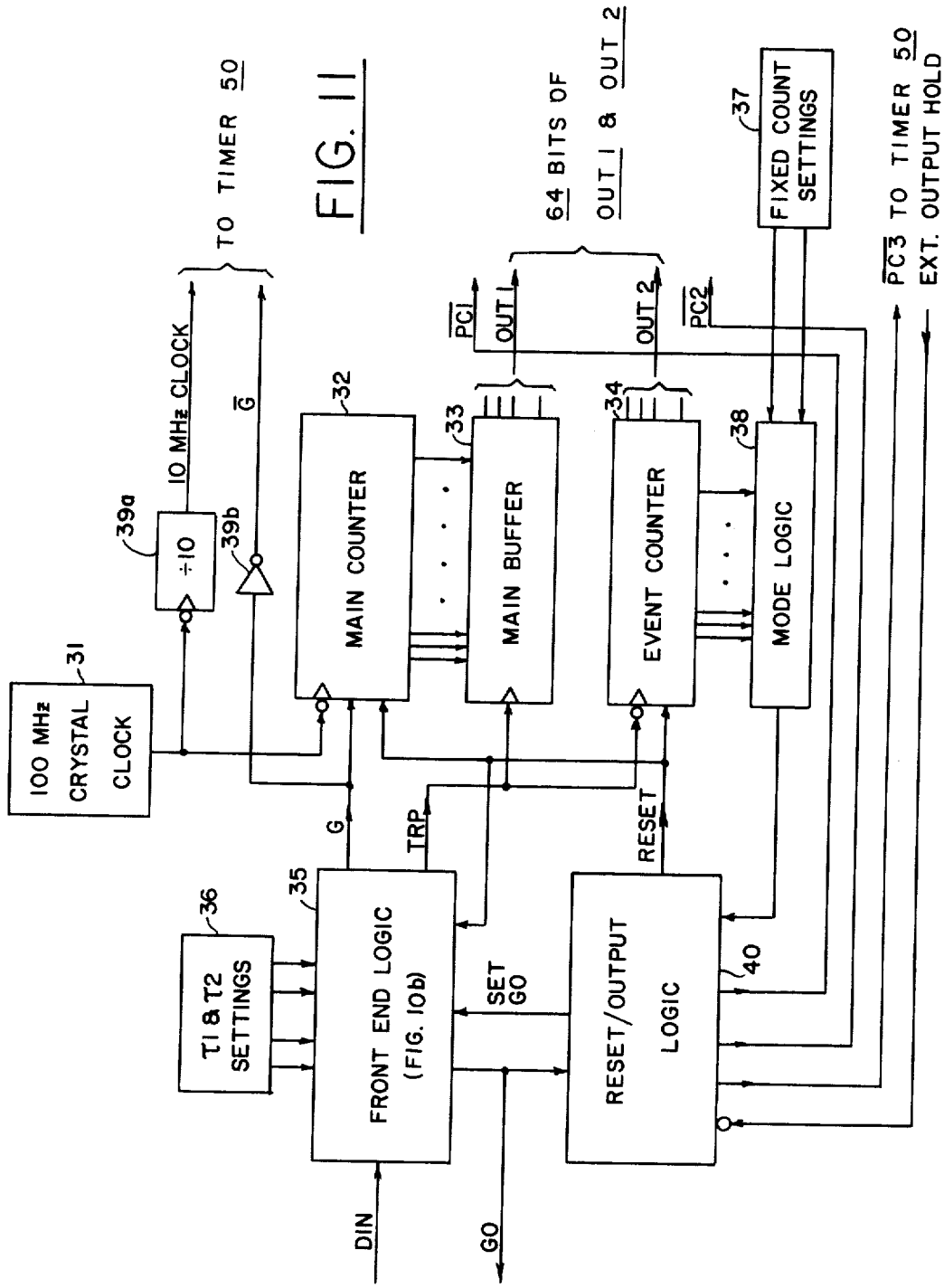

SIGNAL RESPONSIVE BURST PERIOD TIMER AND COUNTER FOR LASER DOPPLER VELOCIMETRY AND THE LIKE

BACKGROUND OF THE INVENTION

This invention relates to a method and apparatus for measuring the period of an oscillatory signal burst containing only a limited number of cycles and occurring at a time which is random (and not known a priori).

An example of such a random signal occurs in making measurements of velocity using the Doppler shift in frequency of laser light scattered by a moving particle by heterodyning the scattered light with the unshifted light to produce a beat frequency burst at the optical receiver of the system. The phenomenon of Doppler shift in frequency is also utilized by many other systems that measure frequency to determine the velocity of a target, such as sonar and radar.

To appreciate the utility of this invention, consider how a traditional frequency counter measures frequency. A traditional frequency counter opens a gate G for a fixed length of time T (say one second) and counts the number of level crossings, of the same sense, of an input signal occurring during the time interval the gate is open (high). (See FIG. 1) This count, N, is then displayed as the frequency of the input signal in cycles per second (Hertz).

It is easy to see that such an instrument is of no use unless it can be guaranteed that the input signal oscillations continue for the whole interval that the signal is accepted by the gate. This proviso is, of course, not met by an oscillatory signal that occurs in bursts, at random times and for a variable number of cycles since a burst may not last for the whole counting interval. This problem is illustrated in FIG. 2 using the same gate of fixed time T.

It is the purpose of this invention to provide the means of measuring the frequency (period) of an input signal consisting of a single burst of an unknown number of cycles of a typical form shown in FIG. 2. A preferred embodiment of the invention was developed to provide the means of analyzing a laser Doppler velocimeter signal in the time domain. Consequently, the motivation for the various different modes of operation, the built-in flexibility of the first implementation of the idea and the available range of values of its operating characteristics (pulse widths, time intervals, etc.) are to be understood with that specific application in mind. It should be emphasized, however, that the utility of this signal processing method extends considerably beyond this purpose. The examples of sonar and radar have already been mentioned. Similar signals are also encountered in earthquake monitoring, where the time (duration) of the signal burst is also not known a priori, and in communications utilizing bursts of frequency modulated or pulse code modulated signals whose carrier frequency for one reason or another cannot be transmitted continuously.

The processing electronics of the invention should be viewed generally as possessing sufficient pattern recognition capabilities to be able to recognize the type of signal burst described above and respond to it for the purposes of measuring its average frequency and/or the instantaneous period on a cycle-by-cycle basis, and the real time of the event. It is for this reason that the processor that incorporates these features, a detailed description of which follows, is denominated a signal responsive burst period counter and timer, hereafter referred to simply as the system.

To achieve this goal, both the amplitude information and the time between successive crossings of zero, or some other predetermined level, are utilized in order to minimize the possibility that random noise will trigger the system and yield a reading in the absence of a valid signal burst. In fact this latter feature renders this device the ideal means to label an event in time electronically, which must be detected elsewhere, for which the penalty of error (false alarm) is very high. For example, one could code the event by a succession of pulses of a predetermined number and period, e.g., 32 pulses spaced individually $13.7 \pm 0.1$ $\mu$sec apart. As will become apparent in the detailed description that follows, the system can be operated in a mode that will not produce a response even if any of the following, almost similar, events have occurred:

i. 31 pulses, or less, individually spaced by $13.7 \pm 0.1$ $\mu$sec apart.
ii. 33 pulses, or more, individually spaced by $13.7 \pm 0.1$ $\mu$sec apart.
iii. 32 pulses exactly, spaced $13.7 \pm 0.1$ $\mu$sec apart on the average but having at least one pair spaced by a smaller or larger interval, with another pair, somewhere else in the pulse train that is appropriately spaced such that the average spacing is within the specified limits.

In order to introduce the motivating principles for the invention, a brief description of laser Doppler velocimetry fundamentals will be presented. There are two common optical arrangements used when making laser Doppler velocimetry measurements. One is the dual-scatter arrangement shown in FIG. 3 in which a laser beam 10 is split by a beam splitter 11 into two parallel beams 10a and 10b of equal intensity. A single focusing lens 12 will focus both beams and will force the two beams to cross (overlap) at the focus, F. The beams have finite beam widths and planar face fronts. Consequently, as the beams go through the overlap volume, the two beams can be considered as plane waves that can form an interference pattern on the surface of a square law detector 13, with linear fringe spacing, $s$, given by the equation $$s = \lambda/2\sin(\theta/2)$$

where $\theta$ is the angle subtended by the two wave vectors that are normal to the planar phase fronts.

If a particle traverses the overlap volume, it will scatter light in all directions and, in particular, in the directions accepted by collection optics 14–16 and narrow band optical filter in front of the detector, a photomultiplier. There the Doppler shifted amplitudes that have been scattered out of the two beams will interfere to yield a photocurrent which is modulated at a frequency, $v_D$, given by the equation $$v_D = v_\perp/s = 2v_\perp/\lambda \sin(\theta/2)$$

where $v_\perp$ is the component of the velocity in the plane of the two beams and perpendicular to their bisector. Since the distance travelled by the scattered light from the two beams is the same between the scattering particle and the photomultiplier, the phase difference of the heterodyning components can be computed equally well on the position of the scattering particle as it traverses the overlap volume. It is therefore equivalent to imagine that the particle is traversing a spatially modulated intensity field and that the photomultiplier sees a temporally modulated intensity whose frequency is given by the particle's velocity component perpendicular to the fringe planes, divided by the fringe spacing. It is in this sense that Eq. 2 is derived. In addition to the modulation at the Doppler frequency, the photocurrent is further characterized by a Gaussian envelope corresponding to the intensity distribution of the overlapping beams. The particular photocurrent patterns that result depend on the way the scattering particle has traversed the overlap volume. Three typical patterns are shown in FIGS. 4a–4c.

In the second optical arrangement, a reference-scatter arrangement, the laser beam 10 is again split into two parallel beams as shown in FIG. 5. However, in this case, one beam, the scattering beam 10a, has most of the laser power, while the other, the reference beam 10b, has a small fraction of the laser power. The two beams are focused on a common point, F, and meet in an overlap volume with approximately planar phase fronts. A scattering particle moving through this overlap volume scatters light from the scattering beam in all directions and, in particular, in the direction of the reference beam which is assumed to be normally incident on the surface of the photomultiplier 13. The photomultiplier thus sees two waves, the reference beam at the laser frequency $\nu_o$, and the scattered wave at a frequency $\nu_o + \nu_D$. The Doppler shift $\nu_D$ is given by Eq. (2) where $\theta$ is the scattering angle (and also the angle subtended by the two beams). Thus the photocurrent, which is proportional to the incident intensity, is modulated at the beat frequency $\nu_D$ (between the two waves) for a time corresponding to the time of passage of a scattering particle through the overlap volume. Typical output patterns in this operating mode are shown in FIGS. 6a–6c.

In either case, if one can determine $\nu_D$, the modulation frequency within the burst, one can measure (to the same accuracy) the component of the velocity of the scattering particle that is in the plane of the two beams and perpendicular to their bisector (perpendicular to the fringe planes). This can result in a complete vector velocity measurement since, to measure a different component, one can simply rotate the beams as required. By this means one actually measures the velocity of the fluid in the common case where the particles move with the local fluid velocity. This can be achieved by processing as many input channels as necessary to achieve a simultaneous measurement of more than one component of the velocity at one or more locations in the flow.

OBJECTS AND SUMMARY OF THE INVENTION

An object of this invention is to provide a signal responsive burst period measuring system.

Another object of the invention is to qualify cycles of an oscillatory signal burst as to amplitude and time information which together afford sufficient pattern recognition capabilities so as to distinguish the burst cycles from any noise present.

Yet another object of this invention is to provide accurate and reliable means of starting and stopping the measurement of the frequency (period) of an input signal burst of an unknown number of cycles.

These and other objects of the invention are achieved by testing every oscillation of an input signal as to its amplitude in both its positive and negative excursions with respect to a reference and, having qualified a cycle as to its amplitude in both polarities, testing for an immediately following reference crossing. The reference may be set to circuit ground or to some voltage level of either polarity with respect to circuit ground. A burst period measurement is then made from one qualified reference crossing to the next. Separate voltage comparing means are provided for each amplitude test.

The circuitry defines two voltage levels symmetrically chosen about a third voltage level ($V_O$) which serves as the reference level. This results in a total of three levels placed at $V_O + V_L$, $V_O$, $V_O - V_L$. The amplitudes $V_O$ and $V_L$ as well as the polarity of $V_O$ can be chosen independently of each other and as required by the input signal characteristics. The qualifying logic requires that the signal excursions about $V_O$ exceed the levels $V_O - V_L$ and $V_O + V_L$. Exceeding the $V_O - V_L$ level causes one comparing means to emit a signal when the $V_O - V_L$ level is crossed. When (and if) the $V_O + V_L$ is subsequently crossed, the other comparing means initiates a signal indicating that both test levels have been exceeded in the proper sequence. A reference-crossing detection means then detects when the analog input signal crosses the reference level from a polarity of the second level. When a qualified reference crossing is detected, the signal indicating that all three qualifying test levels have been crossed is terminated, thus signaling the end of a cycle. The sense and polarity of all the level testing logic can readily be inverted, as by using an inverting or non-inverting signal amplifier at the input, as required. The first time a reference crossing is thus detected and signaled, a gating means is enabled to allow a main counter to begin counting clock pulses. Each subsequent reference crossing, qualified in accordance with the three level logic sequence described above, is tested to determine whether or not it occurs within a preselected time interval as measured from the next preceding qualified reference crossing. If it does, and generates a synchronous pulse, that pulse transfers the contents of the main counter, without stopping it, to a register. A second counter is provided to count the number of these transfer pulses. In this fashion, at any one time within each signal burst, the register contains the total time corresponding to the integral number of periods of cycles that have been qualified, while the second counter contains the number of periods that have been counted thus far. These data can be made available either during the signal burst, if cycle-by-cycle monitoring is required, or at the end of each signal burst if it is sufficient to compute the average period of the qualified cycles. A third counter measures time from some reference point in time. Whenever the gating means is enabled, the content of this third counter is read out to provide a basis for positioning of the corresponding burst in real time.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 11 is an exemplary organization of the digital input processor of FIG. 7.

DESCRIPTION OF PREFERRED EMBODIMENTS

Figure 1:
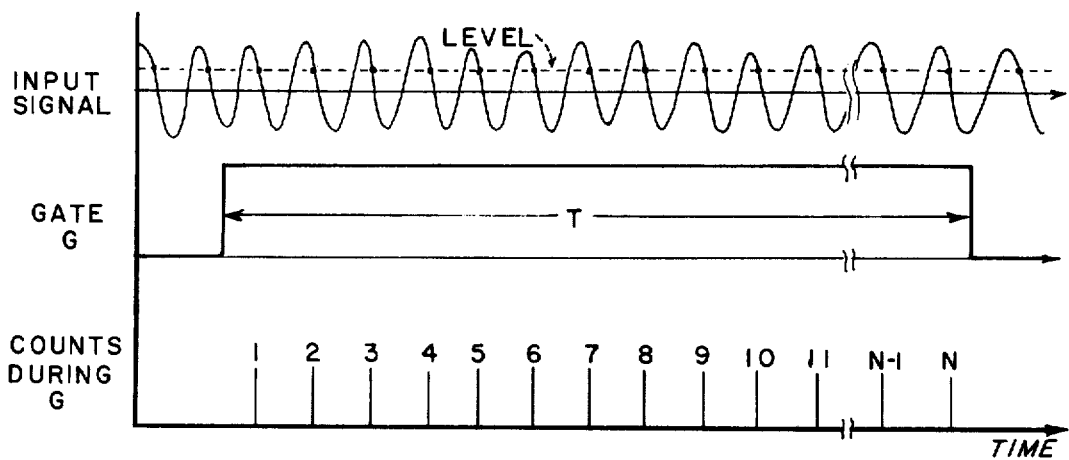
FIG. 1 illustrates a conventional frequency counter principle.
Figure 2:
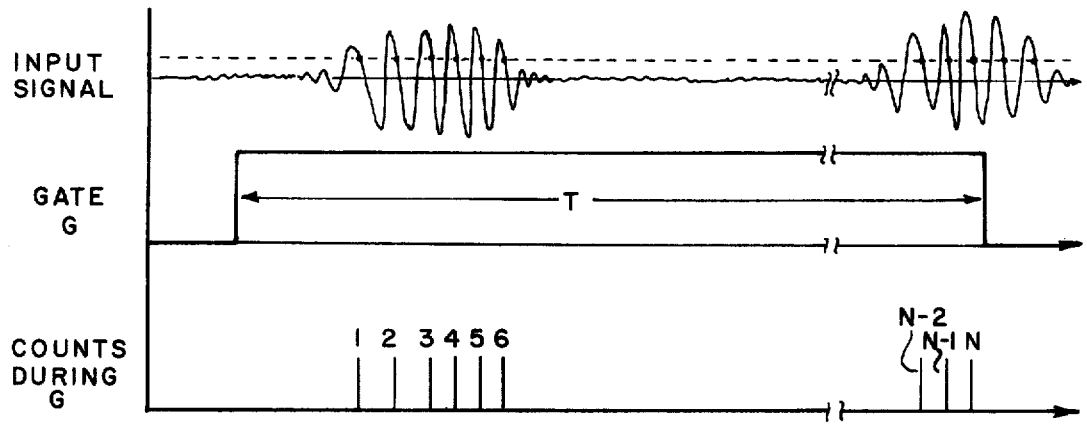
FIG. 2 illustrates the problem of using a conventional frequency counter for an oscillatory signal burst.

In the description of a preferred embodiment that follows, it will be assumed that the input signal burst to be measured undergoes quasi-periodic and quasi-symmetric excursions about zero as shown in FIG. 2. The case of asymmetric bursts (e.g., FIG. 4) will be described later on. It will also be assumed that the signal has been amplified sufficiently by an appropriate bandpass amplifier 19 (shown in FIG. 3) to result in a sufficient peak-to-peak amplitude to clear the $\pm V_L$ settings as required.

Figure 7:
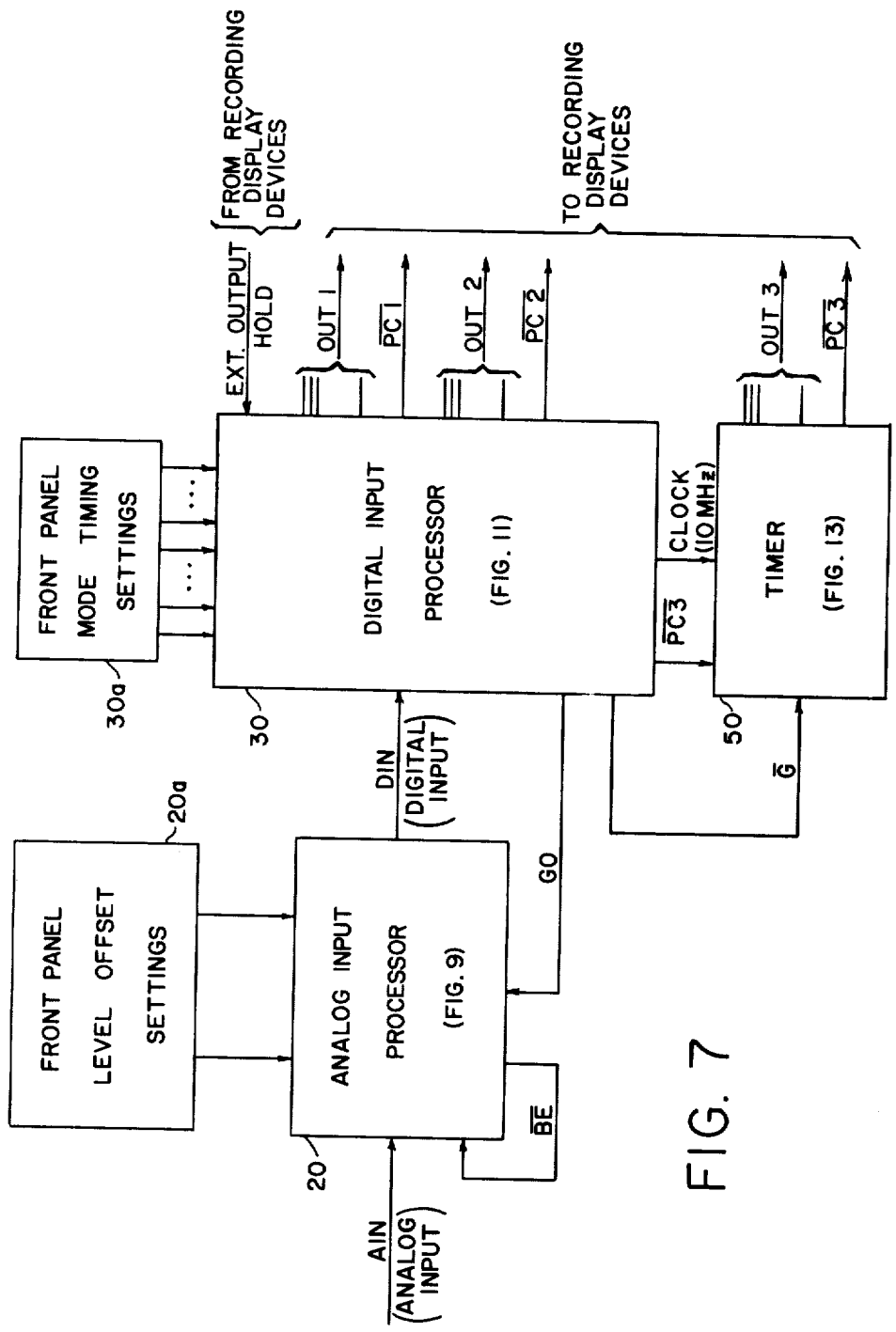
FIG. 7 is a block diagram of a system embodying the present invention.
Figure 8:
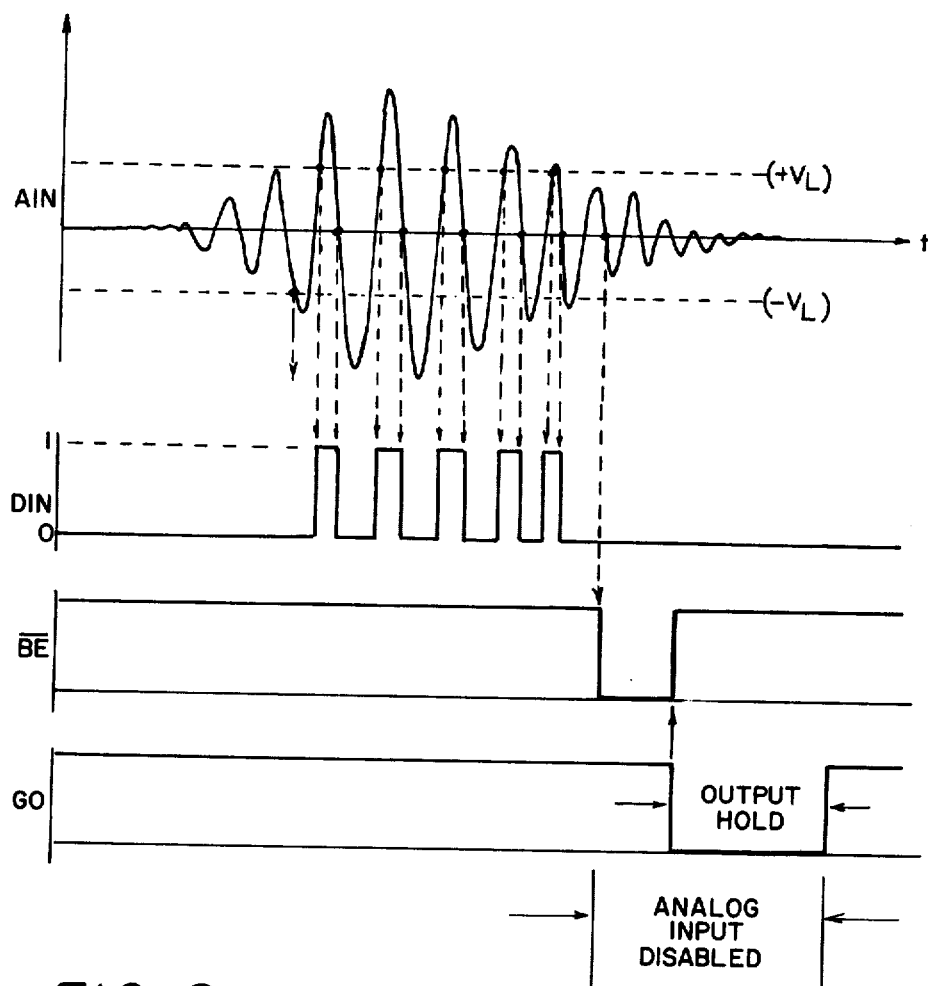
FIG. 8 is a timing diagram illustrating one mode of operation ($v_o$ = signal zero) of an analog input processor in the system of FIG. 7.

The architecture of the signal processing burst period counter and timer is presented schematically in FIG. 7. An analog input processor 20 receives an analog input signal AIN shown in FIG. 8 from the amplifier 19 (FIG. 3) and generates a digital input signal DIN transmitted to a digital input processor 30. The latter signal is a TTL (transistor-to-transistor logic) compatible pulse train whose negative slopes are coincident with the negative slope zero crossings of the analog input. The user can specify through front panel settings 20a an amplitude level $V_L$, to construct two test levels ($-V_L$ AND $+V_L$, indicated by dashed lines in FIG. 8) which must be exceeded by the analog input AIN (in both the positive and negative excursions) and followed by a zero crossing in the proper sense (direction) for a DIN pulse to be generated. it should be noted that the signal DIN remains at the bit 0 level until the positive slope of the analog input signal AIN exceeds the level $+V_L$. The signal DIN then goes to the bit +1 level and remains there until a zero crossing occurs in a following negative slope of the signal AIN. The sequence of positive and negative slopes of the DIN signal described above is repeated with every qualified cycle of the analog input signal AIN. Should a zero crossing occur without the $-V_L$ and $+V_L$ levels being exceeded in amplitude, and in that order it, i. is ignored if no DIN pulse has been generated yet from the burst, or it ii. lowers a burst end signal ($\overline{BE}$) to signify the end of the burst, but only if at least one DIN pulse has been generated. (The assumption has been made that the envelope of a valid input signal burst will rise monotonically to reach a maximum and then fall monotonically to zero.)

While the $\overline{BE}$ signal is low the analog input processor 20 is disabled and will ignore any input signal burst. In that manner DIN pulses are produced from a valid input signal burst, until the analog input signal AIN fails to cross the $-V_L$, $+V_L$ and zero levels in that order, whereupon the zero crossing sets the signal $\overline{BE}$ low to terminate operation of the digital input processor 30 in respect to counting DIN pulses from that burst. The signal $\overline{BE}$ is reset by the negative slope of a GO signal (shown in FIG. 8) from the digital input processor 30 which signifies that the digital input processor has been disabled and is transmitting the burst count to recording and display devices (not shown).

Figure 9:
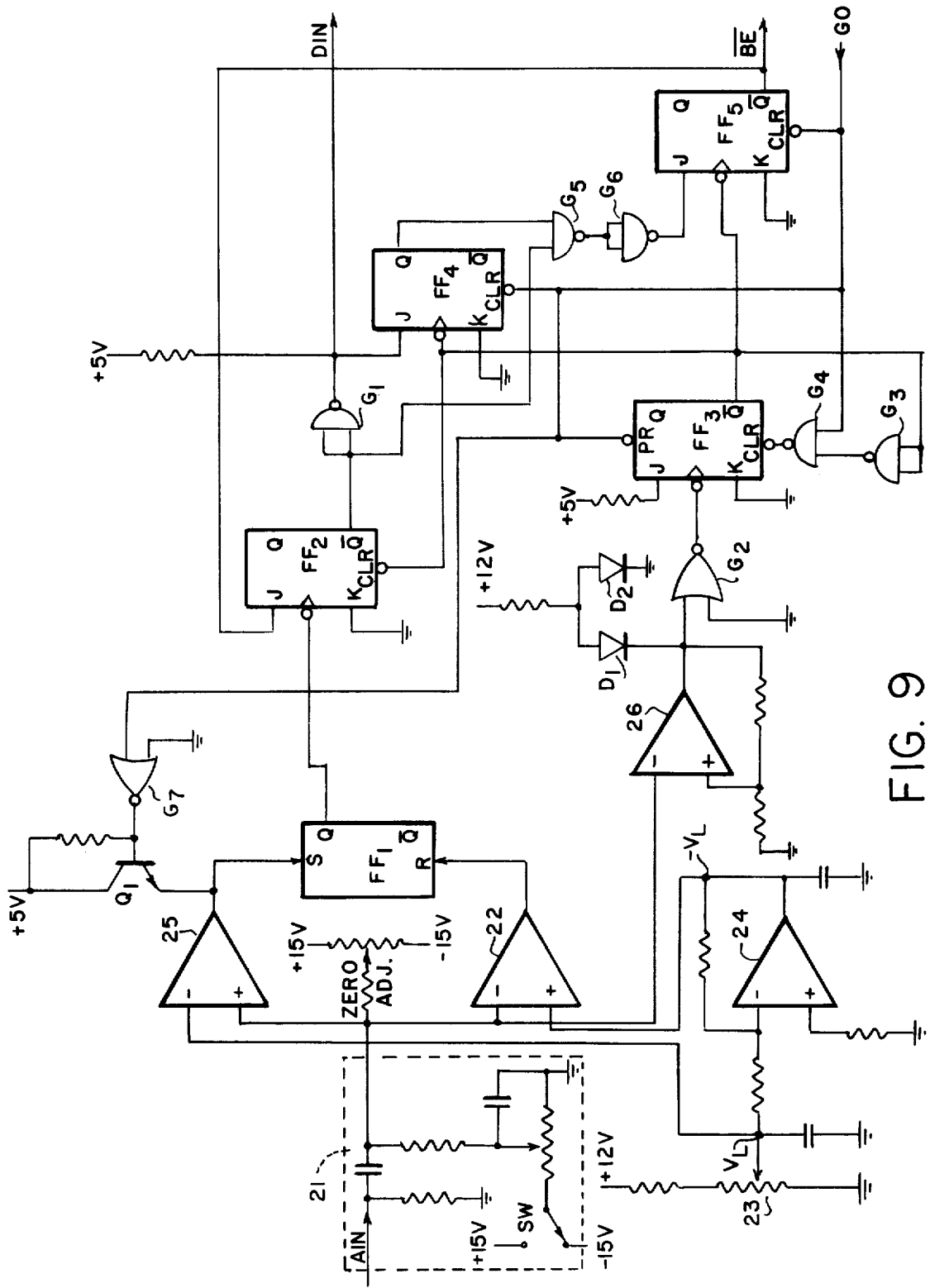
FIG. 9 is an exemplary implementation of the analog input processor.

The analog input processor 20 remains disabled during the time the GO signal is low and is only enabled when the GO signal goes high (output transmission complete, system reset and ready). The GO signal then enables the analog input processor for it to again respond to a burst, but only if the signal AIN exceeds the levels $-V_L$ and $+V_L$ and in that order. An exemplary circuit for such an analog input processor is shown in FIG. 9. It has been tested with signal bursts of frequencies from a few hundred Hertz to 15 Megahertz.

Figure 4C:
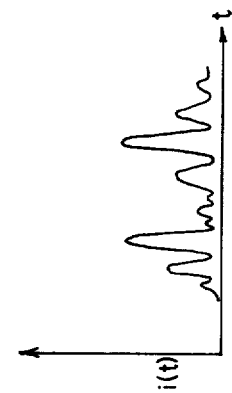
FIGS. 4a–4c illustrate three typical signal patterns of the velocimeter of FIG. 3.
Figure 4B:
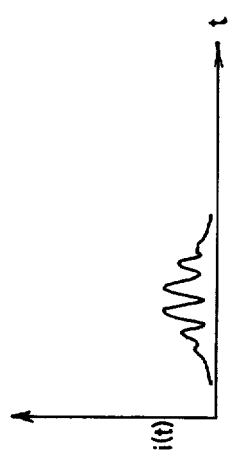
Figure 4A:
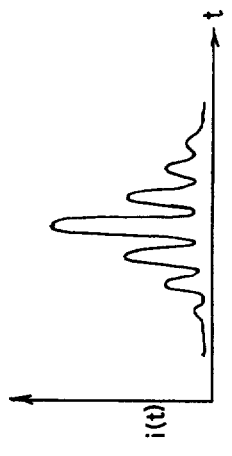
Figure 5:
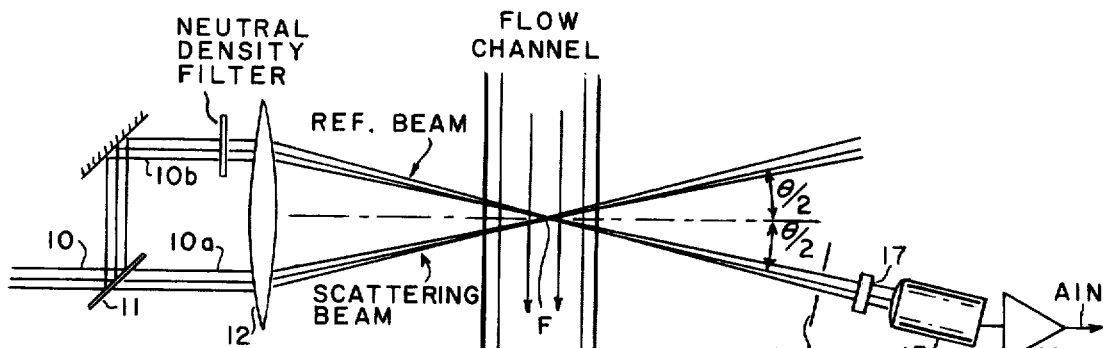
FIG. 5 illustrates schematically a reference-scatter laser Doppler velocimeter.
Figure 6A:
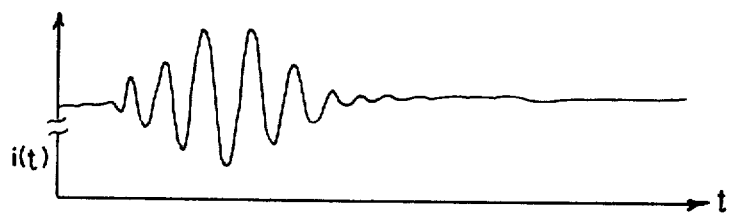
FIGS. 6a–6c illustrate three typical signal patterns of the velocimeter of FIG. 5.
Figure 6B:
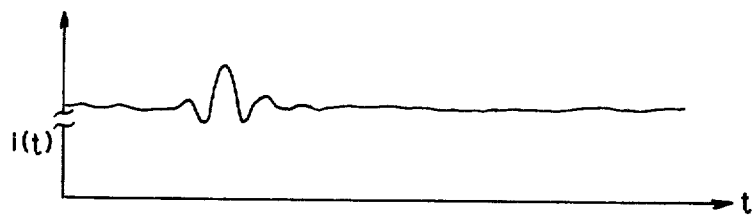
Figure 6C:
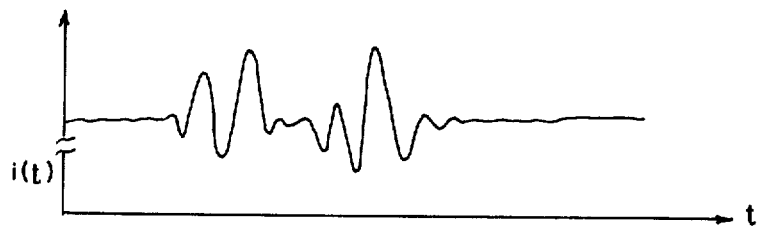

Operation of the circuit shown in FIG. 9 is as follows. A high-pass filter 21 is provided with a switch, SW, on the front panel 20a to offset the zero reference, such as to process signals resulting from the dual-scatter mode as shown in FIG. 4a, as will be more fully described with reference to FIG. 15. For the reference-scatter mode, no offset is required and the switch is set in the position shown. The two levels $-V_L$ and $+V_L$ are thus symmetrically chosen about zero (circuit ground). For a valid zero crossing, it is required that the input waveform exceed both of these levels $-V_L$ and $+V_L$, and in order just prior to a zero crossing.

The signal AIN from the filter 21 is applied directly to the inverting input terminal of a differential amplifier 22 for comparison with the level $-V_L$ set in a potentiometer 23 as a reference level $+V_L$ and inverted by an operational amplifier 24. When the level $-V_L$ is exceeded in amplitude by a negative excursion of a burst, a flip-flop $FF_1$ is set. It remains set until reset by the output of a differential amplifier 25 which compares the analog input AIN with the positive reference $+V_L$. The trailing edge of a pulse thus produced clocks a J-K flip-flop $FF_2$. Its Q output is inverted by a NAND gate $G_1$ to initiate a pulse in the digital input signal DIN. The pulse will persist until the flip-flop $FF_2$ is reset by a zero-crossing detector comprised of a differential amplifier 26. Clamping diodes $D_1$ and $D_2$ provide one sided hysteresis for the zero-crossing detector.

The output of the zero-crossing detector is a positive pulse inverted by a NOR gate $G_2$. The leading edge of the resulting negative pulse from the gate $G_2$ clocks a flip-flop $FF_3$. The Q output of that flip-flop then drops to a low level and clears the flip-flop $FF_2$. It also clears the flip-flop $FF_3$ via NAND gates $G_3$ and $G_4$. At the same time, the output of the flip-flop $FF_3$ clocks a flip-flop $FF_4$, thus storing a bit 1 in the flip-flop $FF_4$. Note that at least one input to a NAND gate $G_5$ is a bit 0, both before and after the flip-flop $FF_2$ is reset. Consequently, the output of the NAND gate $G_5$ remains at a bit 1 level. A NAND gate $G_6$ inverts that signal to a bit 0. Consequently, a flip-flop $FF_5$ will remain reset such that its $\overline{Q}$ output will continue to be high. That $\overline{Q}$ output is fed back as the signal $\overline{BE}$ to the flip-flop $FF_2$ to enable it to again be set when the levels $-V_L$ and $+V_L$ are again exceeded, and in that order. Subsequent pulses are thus produced in the output signal DIN, one pulse for each cycle of the analog input in which the levels $-V_L$ and $+V_L$ are exceeded. Each pulse terminates at the negative-slope zero crossing. Consequently, the periods between the trailing edges of DIN pulses correspond accurately to the periods of the burst cycles.

When a cycle of the burst fails to exceed the level and or the level $+V_L$, and in that order the flip-flop $FF_1$ will not trigger the flip-flop $FF_2$ to initiate another output pulse in the signal DIN. Consequently, when the next zero crossing is detected, both input terminals of the NAND gate $G_5$ will be at the logic 1 level, so when the flip-flop $FF_3$ is clocked by the next output of the zero detector, the flip-flop $FF_5$ is set, thus driving its $\overline{Q}$ output (the signal $\overline{BE}$) low. The flip-flop $FF_5$ remains set to disable the circuit until a signal GO clears the flip-flop $FF_5$. Note that the signal GO is high to enable the NAND gate $G_4$ until the digital input processor drives the signal GO low. The negative slope of the signal GO then resets the flip-flop $FF_5$ to drive the signal $\overline{BE}$ high. The signal $\overline{BE}$ thus signifies that a burst has ended when it goes low.

The digital input (DIN) pulses are sent to the digital input processor 30 (FIG. 7). There the total time interval corresponding to a fixed number of valid zero crossings (i.e., zero crossings following $-V_L$ and $+V_L$ crossings, and in that order, and passing time tests described below), or the total time interval and total number of valid zero crossings within a single burst can be determined. Assuming that the operating mode is the latter of the two, the processing sequence is as follows.

Figure 10A:
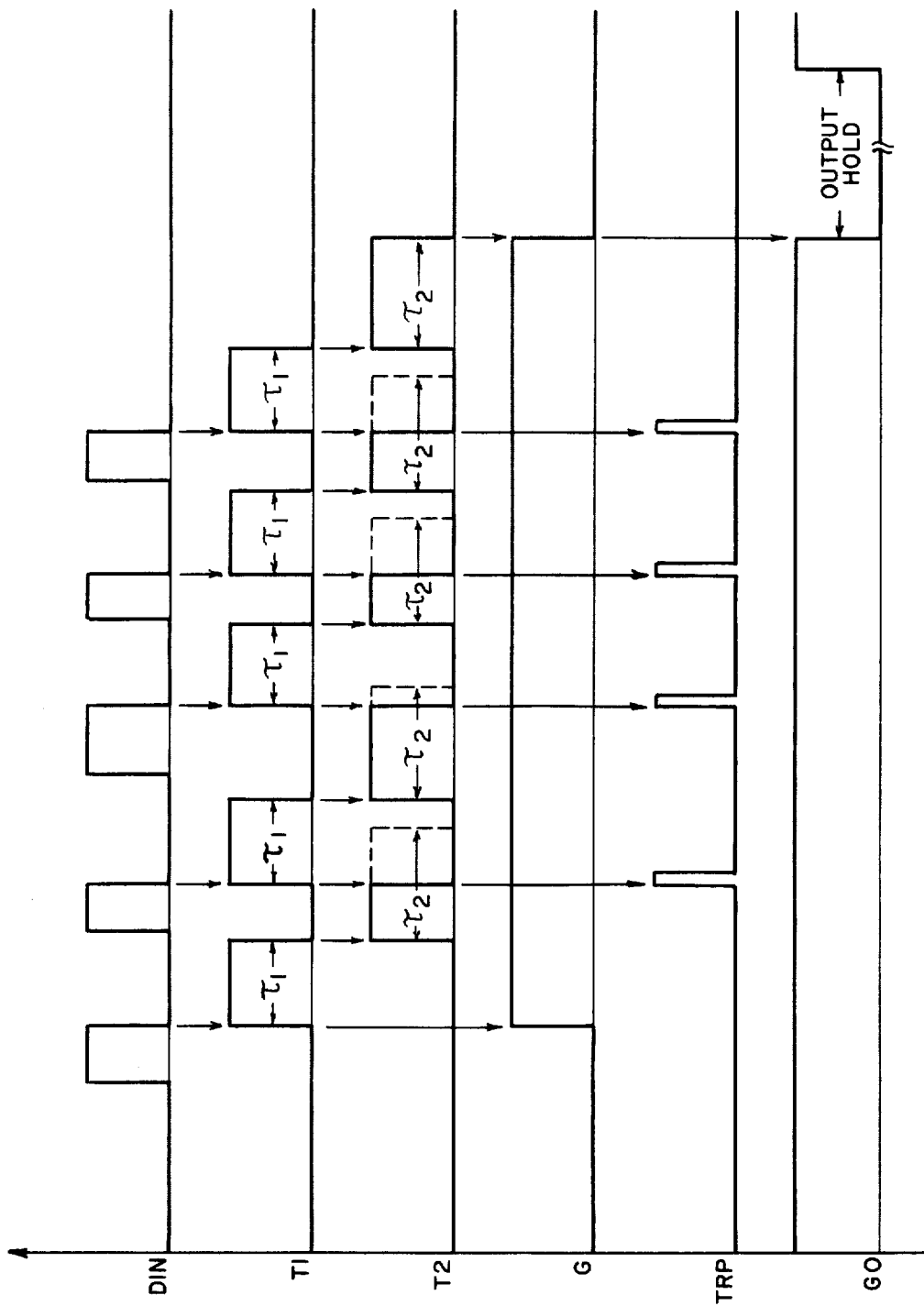
FIG. 10a is a timing diagram illustrating the operation of the front end of a digital input processor in the system of FIG. 7.
Figure 10B:
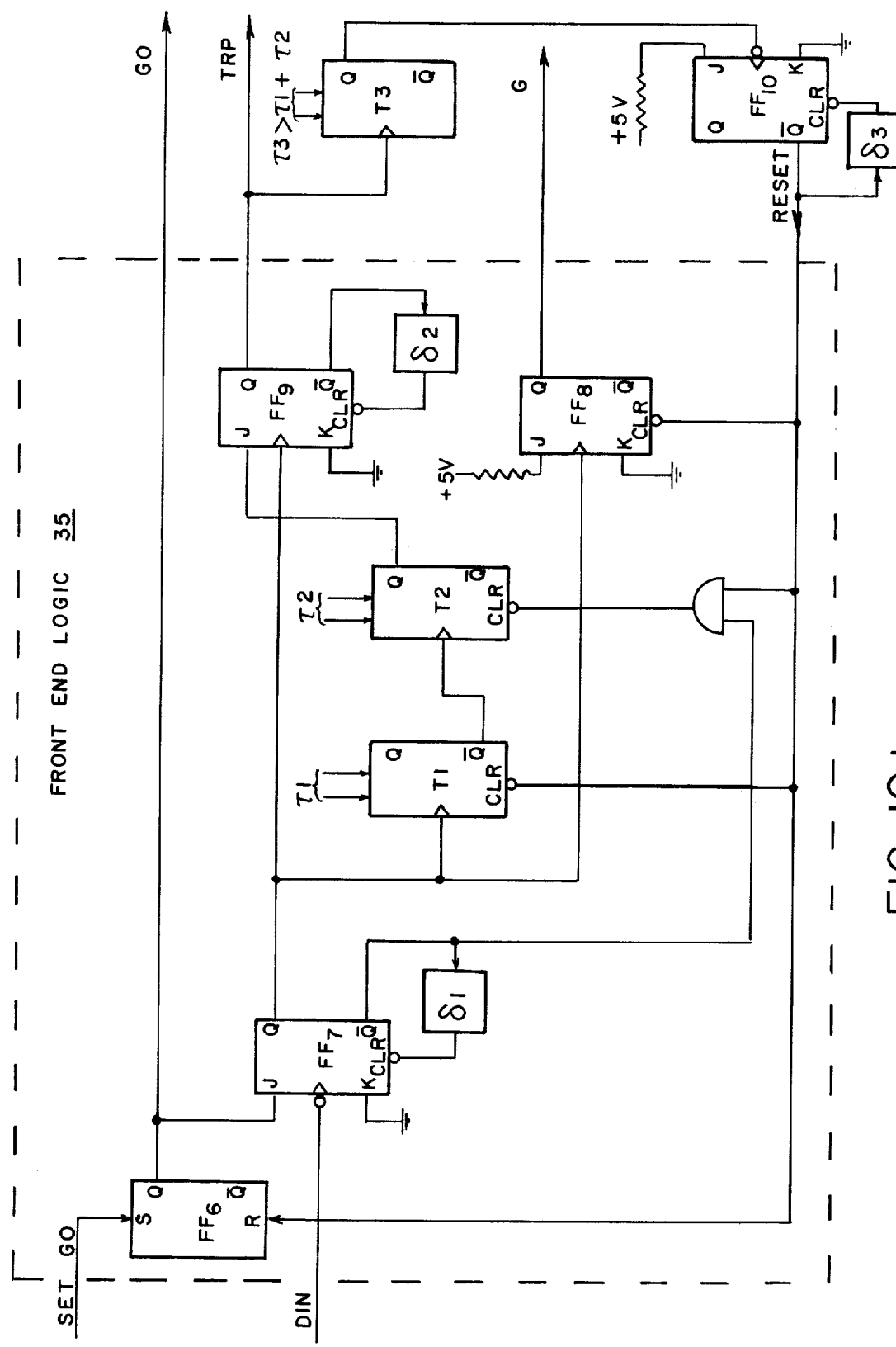
FIG. 10b illustrates an exemplary implementation.

The negative slope of the DIN pulses fires a one-shot TI shown in FIG. 10b. The period $\tau_1$ of that one-shot is set on the digital input processor front panel 30a and sets a flip-flop to raise a gate signal G shown in FIG. 10a. That gates a 100 MHz crystal controlled clock from a source 31 into a main counter 32, shown in FIG. 11. The negative slope of each pulse from the one-shot TI fires a second one-shot T2 whose period $\tau_2$ is also set on the front panel 30a. The next negative slope of DIN refires the one-shot TI, refires the one-shot T2 and generates a transfer pulse TRP, provided it occurs during the period $\tau_2$. The TRP pulse transfers the contents of the main counter 32 into a main buffer 33 and is also counted by an event counter 34. In that manner the number in the main buffer is equal to the total number of clock pulses that have occurred in between the time the gate signal G went high and the positive slope of the first TRP pulse, which is a measure of the duration of the first valid period of the signal burst.

FIG. 10b illustrates an exemplary embodiment of front end logic 35 shown in FIG. 11 for generating the gate signal G and the TRP pulses shown in FIG. 10a. A flip-flop $FF_6$ is set by a signal SET GO from reset and output logic 40 (FIG. 11) at the end of an output hold period in response to a signal EXT. OUTPUT HOLD. Once the signal GO is high, a flip-flop $FF_7$ is enabled to be set by the negative slope (trailing edge) of DIN pulses. A delay element $\delta_1$ couples the $\overline{Q}$ output of the flip-flop $FF_7$ to its clear (CLR) input so that it resets itself. The result is a short positive pulse (of a duration set by the delay element) transmitted from the $\overline{Q}$ output terminal that sets a flip-flop $FF_8$ to raise the signal G.

Each pulse from the flip-flop $FF_7$ triggers the one-shot T1. The one-shot T1 then triggers the one-shot T2 at the end of its period $\tau_1$. Once the one-shot T2 is triggered, it begins to time out its period $\tau_2$. The Q output of the one-shot T2 enables a flip-flop $FF_9$ to be set by a DIN pulse via flip-flop $FF_7$, provided it occurs within the period $\tau_2$. A delay element $\delta_2$ couples the $\overline{Q}$ output of the flip-flop $FF_9$ to its input CLR to reset it. The result is a TRP pulse as shown in FIG. 10a.

Each time the flip-flop $FF_7$ emits a pulse in response to a DIN pulse, the $\overline{Q}$ output of that flip-flop clears (restores to its stable state) the one-shot T2 via an AND gate $G_8$ which has both of its input terminals normally high. In that manner the leading edge of a TRP pulse occurs substantially in time coincidence with the trailing edge of a DIN pulse that coincides with the zero crossing of a cycle qualified by the analog input processor 20 (FIG. 7).

If another DIN pulse is not received before the one-shot T2 times out, reset logic generates a negative pulse on the line labeled RESET to reset the flip-flops $FF_6$ and $FF_8$, thus lowering the signals G and GO, as shown in FIG. 10a, to reset the main and event counters. That reset logic essentially operates on another timer in reset and output logic 40 (FIG. 11) triggered by TRP pulses. If allowed to time out for lack of a following TRP pulse, the $\overline{Q}$ output of that timer sets a resetting flip-flop to generate at its $\overline{Q}$ output terminal a negative RESET pulse. That timer and flip-flop are shown in FIG. 10b as a one-shot T3 and a flip-flop $FF_{10}$ with a delay element $\delta_3$ for the sake of completeness. In the exemplary embodiment of FIG. 11 this reset logic is contained in the reset and output logic 40 in order that mode control logic 38 be employed to sometimes generate the RESET pulse even before the last TRP pulse of a burst, as when only a predetermined number of cycles of a burst are to be timed. In that event the reset logic would be implemented differently, with the function of the reset logic shown in FIG. 10a provided in a different way for one of two alternative modes by the processor sensing when T2 goes low without T1 being triggered. In the second mode, mode logic 38 would determine when the specified number of TRP pulses have been counted by the event counter 34, and would then initiate the generation of the RESET pulse.

In this manner, an input waveform with an instantaneous period $\tau$ is only processed if $$\tau_2 < \tau < \tau_1 + \tau_2$$

The periods $\tau_1$ and $\tau_2$ can be conveniently set using control knobs indicated generally by block 36.

Each TRP pulse will update the contents of the main buffer 33 with the contents of the main counter 32 at the time, and increment the event counter. This process continues (unless a negative slope of DIN occurs outside the $\tau_2$ interval) until the end of the pulse sequence. When the gate signal G is lowered, which in turn lowers the signal GO, the whole system is disabled until GO is again set high, as by a manually operated push button or by some automatic system, at which time the counters 32 and 34 are reset. In this exemplary embodiment, the signal GO is controlled by an external output hold signal that is low until data transfer to recording and display devices is complete, and is then set high. Upon being set high, the reset and output logic 40 resets the counters and emits a "set GO" signal that sets the GO signal high again. While the signal GO is low, it not only disables the gate $G_4$ (FIG. 9) but also disables the comparator 25 from resetting the flip-flop $FF_1$. That is done via a NOR gate $G_7$ and transistor $Q_1$. When the GO signal is set high again, it releases the comparator 25, presets the flip-flop $FF_3$ with its Q output high, and clears the flip-flops $FF_4$ and $FF_5$ as shown in FIG. 9.

Figure 12A:
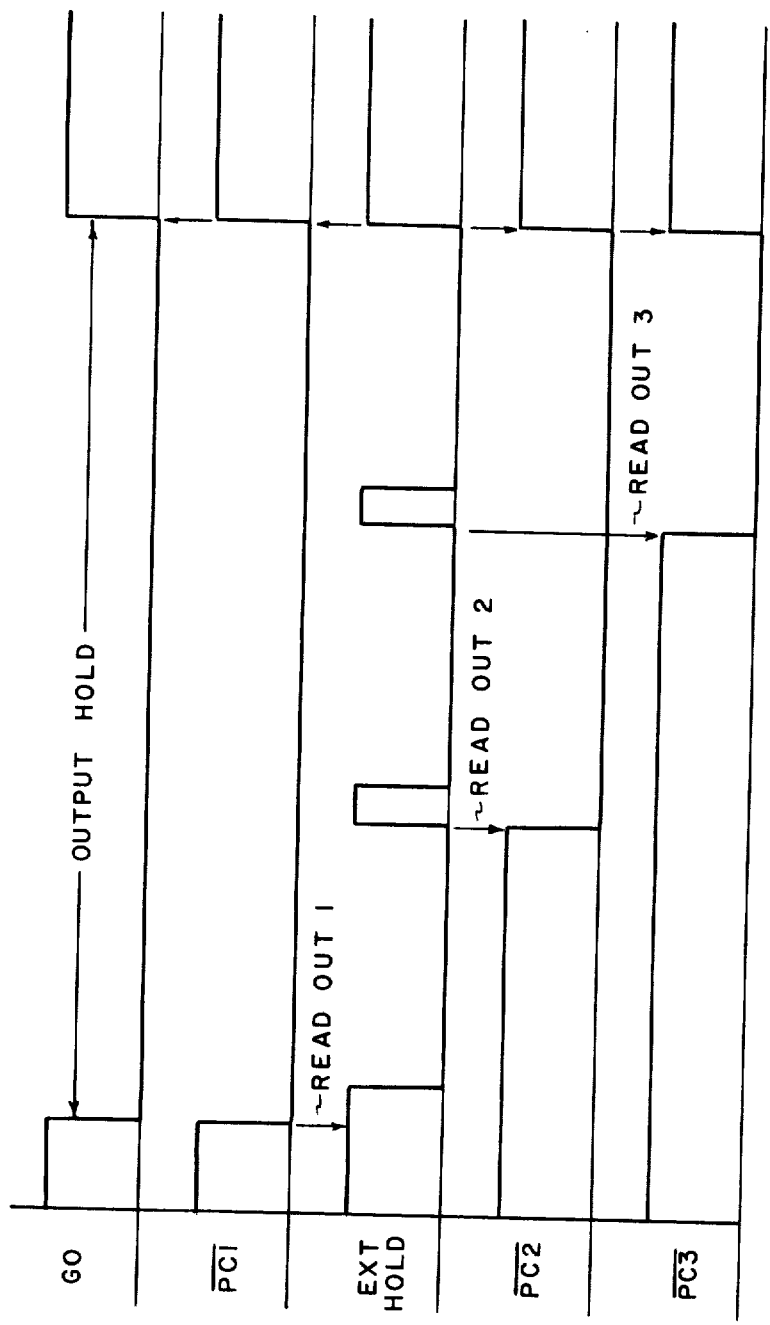
FIG. 12a is a read-out timing diagram for the digital input processor of FIG. 11.
Figure 12B:
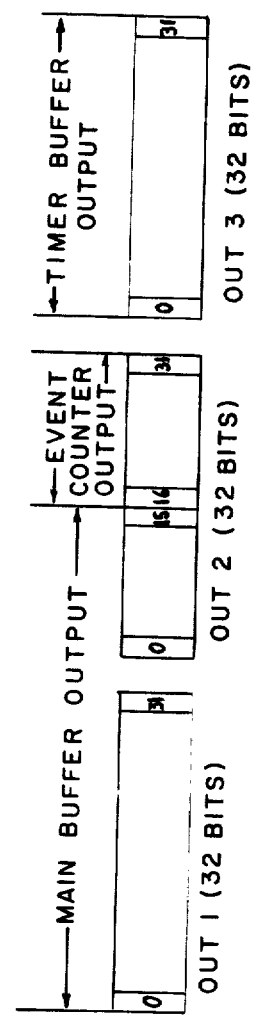
FIG. 12b illustrates the format of data read out of the digital input processor.
Figure 13:
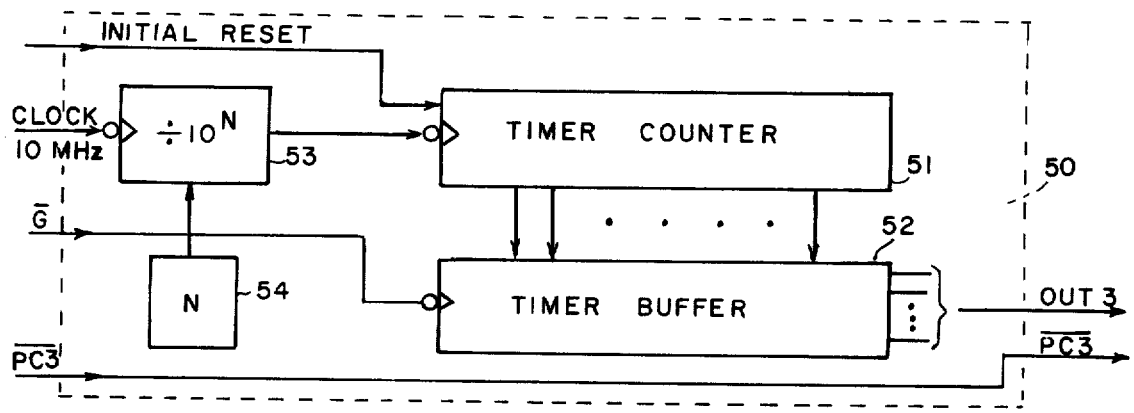
FIG. 13 is an exemplary organization of the timer in the system of FIG. 7.

Lowering the signal GO generates the readout commands ($\overline{PC1}$, $\overline{PC2}$, $\overline{PC3}$) which flag the data transfer (words OUT 1, OUT 2 and OUT 3, respectively) to recording and display devices as shown in FIG. 12a. FIG. 12b shows the format of the output data, OUT 1, OUT 2 and OUT 3. The OUT 3 data is the content of a timer counter 51 loaded into the timer buffer 52 of the timer 50 (FIG. 13) by the positive slope (leading edge) of each TRP pulse. This permits the time of each cycle of a burst to be read out in a manner described hereinafter with reference to FIG. 14 in order to reconstruct the burst, or determine its frequency (period) on a cycle-by-cycle basis.

In alternative modes of operation, a specified number of zero crossings can be set on the front panel 30a (FIG. 7) through knobs indicated generally in FIG. 11 by block 37, and the burst data will only be transmitted to the display and recording devices if a burst contains a number of cycles with valid zero crossings.

i. less than or equal to the specified number
ii. equal to the specified number, or
iii. greater than or equal to the specified number as determined by mode logic 38. The choice between the three is also made on the front panel 30a.

The digital input processor shown in FIG. 11 provides a 10 MHz square wave (100 MHz ÷ 10) via a divider 39a and the inverse of G ($\overline{G}$) via an inverter 39b. There are used by the timer 50 (FIG. 13) to record the real time of the first valid zero crossing. Since the processor does not know in advance that the subsequent burst characteristics will pass all the imposed tests, the real time of the first valid zero crossing is always transferred from a timer counter 51 to a timer buffer 52. However, it is only transmitted to the recording devices using the output command $\overline{PC3}$ shown in FIG. 12a. In this manner both the real time in buffer 52 and the total time interval of a succession of zero crossings in the main buffer 33 is recorded, and it is possible to reconstruct from that data the time history of the average valid zero crossing periods. If a time history on a cycle-by-cycle basis is desired, the content of the main buffer 33 could be read out in response to a PC1 command after each TRP pulse generated as shown in FIG. 14.

Figure 14:
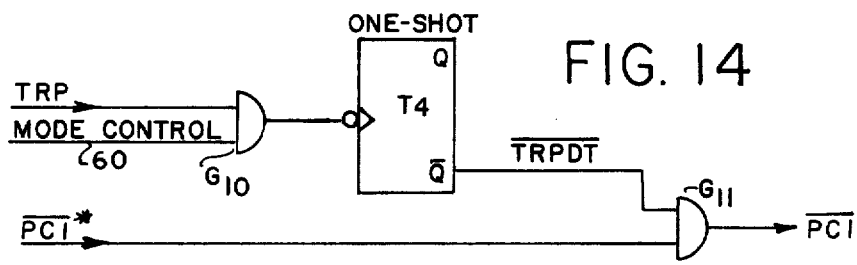
FIG. 14 illustrates a modification of the system of FIG. 7 for reading out time history data on a cycle-by-cycle basis.

Referring now to FIG. 14, simple AND gates $G_{10}$ and $G_{11}$ may be employed with some suitable pulse delay means, such as a one-shot (monostable multivibrator) T4, to provide for reading out the main buffer after every TRP pulse. A mode control signal on a line 60 enables the AND gate $G_{10}$ to transmit each TRP pulse for this mode of operation. The negative slope (trailing edge) of each TRP pulse thus gated triggers the one-shot 60 to emit a pulse $\overline{TRPDT}$ which is essentially the TRP pulse delayed and inverted. Both the normal $\overline{PC1}$ line shown in FIG. 14 as $\overline{PC1}^*$ and the $\overline{TRPDT}$ line are normally high so that when either goes low a PC1 command is transmitted from the gate $G_{11}$, which is when the normal $\overline{PC1}^*$ line goes low at the end of a burst, and each time a TRP pulse triggers the one-shot T4 while the mode control line 60 is high. When not in this mode, i.e., when the mode control signal on the line 60 is low, only the normal print command signal $\overline{PC1}$ is transmitted by the gate $G_{11}$.

It should be noted that the 10 MHz clock is divided by a variable divider 53 set by switches in a front panel 54. In that manner the unit of time counted by the timer counter 51 can be selected for the particular application and operating environment. The time counter is reset to zero by INITIAL RESET when the system is initialized so that the real time counted and recorded is relative to the last time the system was initialized. It is with reference to that time that real time is measured.

Figure 3:
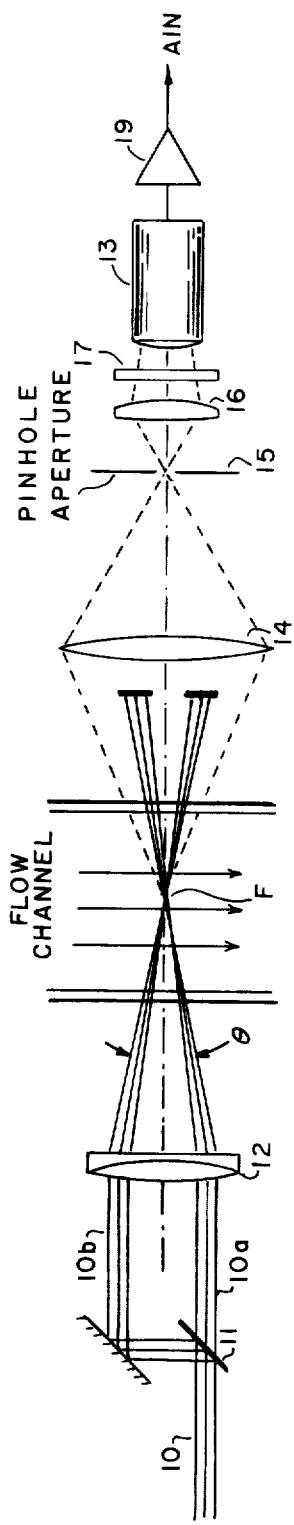
FIG. 3 illustrates schematically a dual-scatter laser Doppler velocimeter.
Figure 15:
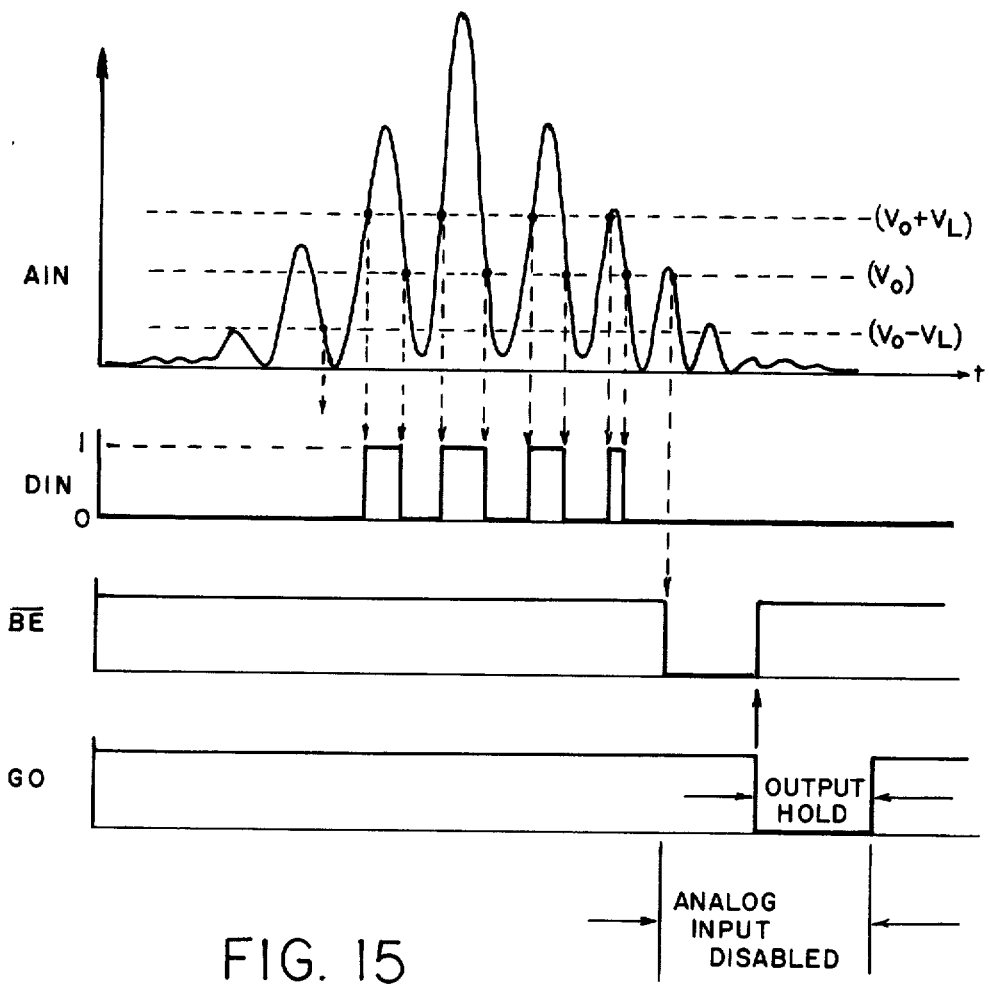
FIG. 15 is a timing diagram illustrating an alternate mode of operation ($v_o > v_L > 0$) of the analog input processor in the system of FIG. 7.

To process one-sided signal excursions, like the output from the laser Doppler velocimeter operated in the dual scatter mode as described with reference to FIG. 3, the zero of the analog input processor from a bandpass amplifier 19 can be offset by an amount $V_o$ through setting the switch SW shown in FIG. 9 in its alternate position. The logic of the amplitude discrimination is then the same, except that the level comparisons are now done on $V_O - V_L$ and $V_O + V_L$ as shown in FIG. 15.

From the foregoing it is evident that a signal responsive burst period counter and timer is made possible through the operation of the analog input processor in lowering the signal $\overline{BE}$ at the end of a burst, and in recognizing the beginning and end of each burst. Exemplary modes of use have been described. Other modes will occur to those skilled in the art. Applications and operating environments other than in laser Doppler velocimeters will also occur to those skilled in the art. It is therefore intended that the claims be interpreted to cover such other modes, and such other applications and operating environments. For instance, in some operating environments, the levels $+V_L$ (or $V_O - V_L$) and $-V_L$ (or $V_O - V_L$) may be tested in that order, and the zero (or reference) crossing detection that follows would be on the positive slope of the analog input signal. The output DIN of the analog input processor may then be used by a digital input processor in a variety of ways as described since each pulse of the output DIN occurs with its negative (positive) slope at its end in what is effectively the precise real time of a negative (positive) reference crossing of a qualified cycle in a burst, i.e., in a cycle which satisfies amplitude criteria. Any time delay between the actual reference crossing of a cycle and the end of the DIN pulse produced will be quite small and constant from one reference crossing to the next. Consequently, the periods between the ends of successive DIN pulses will correspond accurately to the periods of corresponding cycles in the burst. How these pulses are then used will depend upon the users requirement and operating environment.

What is claimed is:

1. A method of detecting and qualifying a first and each successive cycle of a signal as to a criterion relating to voltage amplitude for accurate timing of the period of each succeeding cycle, comprising the steps of
   comparing said signal with voltages of first and second levels with respect to a reference to determine when said signal exceeds said voltages in a predetermined order of the first level followed by the second level and then a reference crossing, and always in that order, to determine the presence of a valid cycle,
   detecting the time said signal crosses said reference in a direction from the second one of said two levels for each cycle, and producing a pulse for each cycle qualified, said pulse having a voltage transition coincident with said reference crossing.

2. A method as defined in claim 1 wherein said reference is zero with respect to circuit ground and said two voltage levels are equal in absolute value but of opposite polarity.

3. A method as defined in claim 1 wherein said reference is a selected voltage with respect to circuit ground and said two voltage levels are voltages equally above and below said selected voltage.

4. A method as defined in claim 1 wherein said signal is first amplified over a wide band of frequencies, to increase the slope of said signal at the point of crossing said reference, and then filtered to pass only a limited band of frequencies, to exclude noise signal at frequencies outside an expected band of frequencies in said signal.

5. A method as defined in claim 1 including the steps of initiating the counting of clock pulses generated at a known and constant frequency significantly higher than the frequency of cycles in said signal when the first reference crossing is detected at the end of the first qualified cycle and reading out the total number of clock pulses counted after each subsequent reference crossing is detected.

6. The method of claim 5 including the step of counting the number of times the total clock pulse count is read out, thereby providing data as to the period of each cycle following the first qualified cycle, and data as to the average period over a number of qualified cycles following the first.

7. The method of claim 6 including measuring real time from a point in time preceding the first qualified cycle of said number of qualified cycles, and reading out as the initial time of said number qualified cycles, whereby the entire number of cycles may be reconstructed in time as to average periods of all cycles measured.

8. A method as defined in claim 7 including the step of timing out a maximum period during which a qualified cycle must occur after each qualified reference crossing is detected, restarting the timing out process each time a qualified reference crossing is detected before the maximum period expires, and stopping all cycle qualifying, timing and counting when the maximum period expires without a qualified reference crossing being detected, thereby starting and stopping the cycle and period timing process in response to the last cycle of a number of successive cycles qualified.

9. Apparatus for detecting and qualifying each cycle of a signal as to voltage amplitude for accurate timing of the period of each succeeding cycle also qualified as to amplitude, comprising
a first comparing means for comparing said signal with a voltage of one polarity with respect to a reference voltage to determine when said signal exceeds said voltage,
a second comparing means for comparing said signal with a voltage of a polarity opposite said one polarity with respect to said reference voltage to determine when said signal exceeds said voltage,
means for detecting when said signal crosses said reference voltage from a voltage of said one polarity to a voltage of said other polarity, and
means responsive to said first and second means both qualifying a cycle of said signal as to amplitude, and in successive order, and to said reference crossing means for producing a signal transition indicating the beginning of another cycle of said signal.

10. Apparatus as defined in claim 9 wherein said reference is zero with respect to circuit ground and said two voltages are equal in absolute value but of opposite polarity.

11. Apparatus as defined in claim 9 wherein said reference is a selected voltage with respect to circuit ground and said two voltages are voltages equally above and below said selected voltage.

12. Apparatus as defined in claim 9 including wideband amplifying means for amplifying said signal to increase the slope of said signal at the point of crossing said reference, and bandpass filtering means for coupling said amplifying means to said first and second comparing means, and to said reference crossing detecting means.

13. Apparatus as defined in claim 9 including
a source of clock pulses generated at a known and constant frequency significantly higher than the frequency of cycles in said signal,
means for counting said clock pulses,
means for gating said clock pulses to said counting means,
means for enabling said gating means to transmit said clock pulses to said counting means from the time a first reference crossing is detected by said detecting means until after the last reference crossing is detected, and
means responsive to said signal transition from reference crossing detecting means for reading out the total count of said counting means upon each reference crossing being detected.

14. Apparatus as defined in claim 13 including means for counting the number of times the total clock pulse count is read out, thereby providing data as to the period of each cycle following the first qualified reference crossing, and data as to the average period over a number of qualified cycles following the first.

15. Apparatus as defined in claim 14 including means for measuring time from a point in time preceding the first qualified cycle and reading out that measured time as the initial time of qualified cycles, whereby an entire burst of qualified cycles may be reconstructed in time as to all cycles measured as to their periods.

16. Apparatus for detecting and qualifying each cycle of an oscillatory signal containing only a number of cycles in a burst comprising
means for comparing said signal with voltages of positive and negative polarity with respect to a reference to determine when said signal exceeds said voltages in a predetermined order to determine the presence of a valid burst cycle,
means for initiating a pulse upon the second of said two voltages being exceeded when the first of said two voltages has been exceeded without first crossing said reference from the polarity of said second one of said two voltages,
means for detecting the time said signal crosses said reference from the polarity of said second one of said two voltages, and
means responsive to said detecting means for immediately terminating said pulse upon detecting said signal crossing said reference.

17. Apparatus as defined in claim 16 wherein said reference is zero with respect to circuit ground and said two voltages are equal in absolute value but of opposite polarity.

18. Apparatus as defined in claim 16 wherein said reference is a selected voltage with respect to circuit ground and said two voltages are voltages equally above and below said selected voltage.

19. Apparatus as defined in claim 16 including means for first amplifying said signal over a wide band of frequencies, to increase the slope of said signal at the point of crossing said reference, and means for filtering the amplified signal to pass only a limited band of frequencies, to exclude noise signal at frequencies outside an anticipated range of frequencies in said signal corresponding to anticipated range of velocities.

20. Apparatus as defined in claim 16 including means for producing clock pulses at a known and constant frequency significantly higher than the frequency of cycles in said signal burst, and means for counting clock pulses from the time the first reference crossing is detected at the end of the first amplitude qualified cycle, a buffer, and means responsive to said reference crossing detection means for reading into said buffer the total number of clock pulses counted by said counting means after each subsequent reference crossing is detected.

21. Apparatus as defined in claim 20 including means for counting the number of times the total clock pulse count is read out into said buffer, thereby providing data as to the period of each burst cycle following the first qualified reference crossing, and data as to the average period over a number of qualified cycles following the first.

22. Apparatus as defined in claim 21 including means for timing out a maximum period during which a qualified cycle must occur after each qualified reference crossing is detected, means for restarting said timing out means each time a qualified reference crossing is detected before the maximum period expires, and means for stopping all operations when the maximum period expires without a qualified reference crossing being detected, thereby starting and stopping the burst period counting and timing in response to the signal burst itself.

23. A method for qualifying each cycle of a signal comprising the steps of
testing said signal as to its amplitude exceeding a first predetermined level of a given polarity with respect to a reference,
testing said signal as to its amplitude exceeding a second predetermined level of a polarity opposite said given polarity after first exceeding said first level,
testing said signal as to its crossing said reference in a direction from said second level after exceeding said first and second levels, and in that order,
testing to determine whether each subsequent reference crossing thus qualified as to crossing three levels in a fixed sequence occurs within a preselected time interval as measured from the next preceding and qualified reference crossing, and
qualifying the first and each successive cycle on the basis of the zero corssing and time interval testing steps being satisfied in the successive order enumerated for each cycle.

24. A method as defined in claim 23 wherein said reference is zero volts with respect to circuit ground and said first and second predetermined voltages are equal in absolute value but of opposite polarity.

25. A method as defined in claim 24 wherein said reference is a selected voltage with respect to circuit ground and said first and second predetermined levels are voltages equally above and below said selected voltage.

26. A method as defined in claim 25 wherein said signal is first amplified over a wide band of frequencies, to increase the slope of said signal at the point of crossing said reference, and then filtered to pass only a limited band of frequencies, to exclude from said signal after amplification noise at frequencies outside an expected band of frequencies in said signal.

27. Apparatus for qualifying each cycle of an oscillatory signal comprising,
means for comparing said signal with voltages of positive and negative polarity with respect to a reference to determine when said signal exceeds said voltages in a predetermined order to determine the presence of a valid cycle,
means for detecting the time said signal crosses said reference from the polarity of said second one of said two voltages, upon the second of said two voltages being exceeded when the first of said two voltages has been exceeded without first crossing said reference from the polarity of said second one of said two voltages, and
means for testing each cycle thus qualified as to amplitude by said comparing means and detecting means to determine whether or not it occurs within a preselected time interval as measured from the next preceding reference crossing of an amplitude qualified signal, thereby qualifying an amplitude qualified cycle as to its period.

28. Apparatus as defined in claim 17 wherein time interval testing means is comprised of means for timing out a maximum period during which a qualified cycle must occur after each qualified reference crossing is detected, means for restarting said timing out means each time a qualified reference crossing is detected before the maximum period expires, and means for stopping all operations when the maximum period expires without a qualified reference crossing being detected, thereby starting and stopping the burst period counting and timing in response to the signal burst itself.

29. Apparatus as defined in claim 28 including means for producing clock pulses at a known and constant frequency significantly higher than the frequency of cycles in said signal burst, and means for counting clock pulses from the time the first reference crossing is detected at the end of the first amplitude qualified cycle, a buffer, and means responsive to said reference crossing detection means and said time interval testing means for reading into said buffer the total number of clock pulses counted by said counting means after each subsequent reference crossing is detected.

30. Apparatus as defined in claim 29 including means for counting the number of times the total clock pulse count is read out into said buffer, thereby providing data as to the period of each cycle following the first qualified reference crossing, and data as to the average period over a number of qualified cycles following the first.

* * * * *